United States Patent
Wong et al.

(10) Patent No.: US 9,140,748 B2
(45) Date of Patent: Sep. 22, 2015

(54) BURN IN BOARD, SYSTEM, AND METHOD

(75) Inventors: Kin Sun Wong, Hsinchu (TW); Che Chin Wu, Hsinchu (TW)

(73) Assignee: Macronix International Co., Ltd., Hsin-chu (TW)

( * ) Notice: Subject to any disclaimer, the term of this patent is extended or adjusted under 35 U.S.C. 154(b) by 752 days.

(21) Appl. No.: 13/470,789

(22) Filed: May 14, 2012

(65) Prior Publication Data

US 2013/0300444 A1 Nov. 14, 2013

(51) Int. Cl.
*G01R 31/10* (2006.01)
*G01R 31/28* (2006.01)

(52) U.S. Cl.
CPC .................................. *G01R 31/2863* (2013.01)

(58) Field of Classification Search
CPC ............................ G01R 31/10; G01R 31/2836
USPC ....................... 324/500, 750.05, 527, 750.15, 324/750.3–754.11, 755.01, 756.02–757.04, 324/762.02–763.01; 714/724, 726, 729, 714/733, 734, 727; 702/117–119, 123, 108
See application file for complete search history.

(56) References Cited

U.S. PATENT DOCUMENTS

2006/0186912 A1\* 8/2006 Norris ........................... 324/765

FOREIGN PATENT DOCUMENTS

TW M422074 U1 2/2012

\* cited by examiner

*Primary Examiner* — Melissa Koval
*Assistant Examiner* — Trung Nguyen
(74) *Attorney, Agent, or Firm* — Alston & Bird LLP (57) ABSTRACT

Systems, methods, and apparatuses are provided for facilitating the use of a burn in board comprising integrated circuits. An apparatus may comprise a burn in board and a plurality of integrated circuits connected to the burn in board. Each integrated circuit may be configured to at least connect to a plurality of components to be subjected to a burn in process at room temperature; receive at least one signal for testing the plurality of components during the burn in process; and transmit the at least one signal to each of the plurality of components. Corresponding systems and methods are also provided.

19 Claims, 4 Drawing Sheets

BURN IN BOARD, SYSTEM, AND METHOD

TECHNOLOGICAL FIELD

Example embodiments of the present invention relate generally to improved burn in boards and, more particularly, relate to burn in boards comprising one or more integrated circuits.

BACKGROUND

A common practice in the testing of hardware components involves a process known as burn in. The purpose of a burn in process is to subject the components to a stress test to identify those components that are defective. In many instances, the components may be subjected to higher or more sustained voltages than they would typically experience during operation. Such a burn in process is typically conducted in an environment having an elevated temperature, such as a burn in oven.

To subject the components to a burn in process, the components may be connected to a burn in test system. The burn in test system may comprise a burn in machine, often associated with the burn in oven, and a burn in board. The burn in board may allow a plurality of the components to be connected and subjected to the burn in process at the same time. The burn in machine may then provide and receive one or more signals from the burn in board comprising the connected components.

Figure 1:
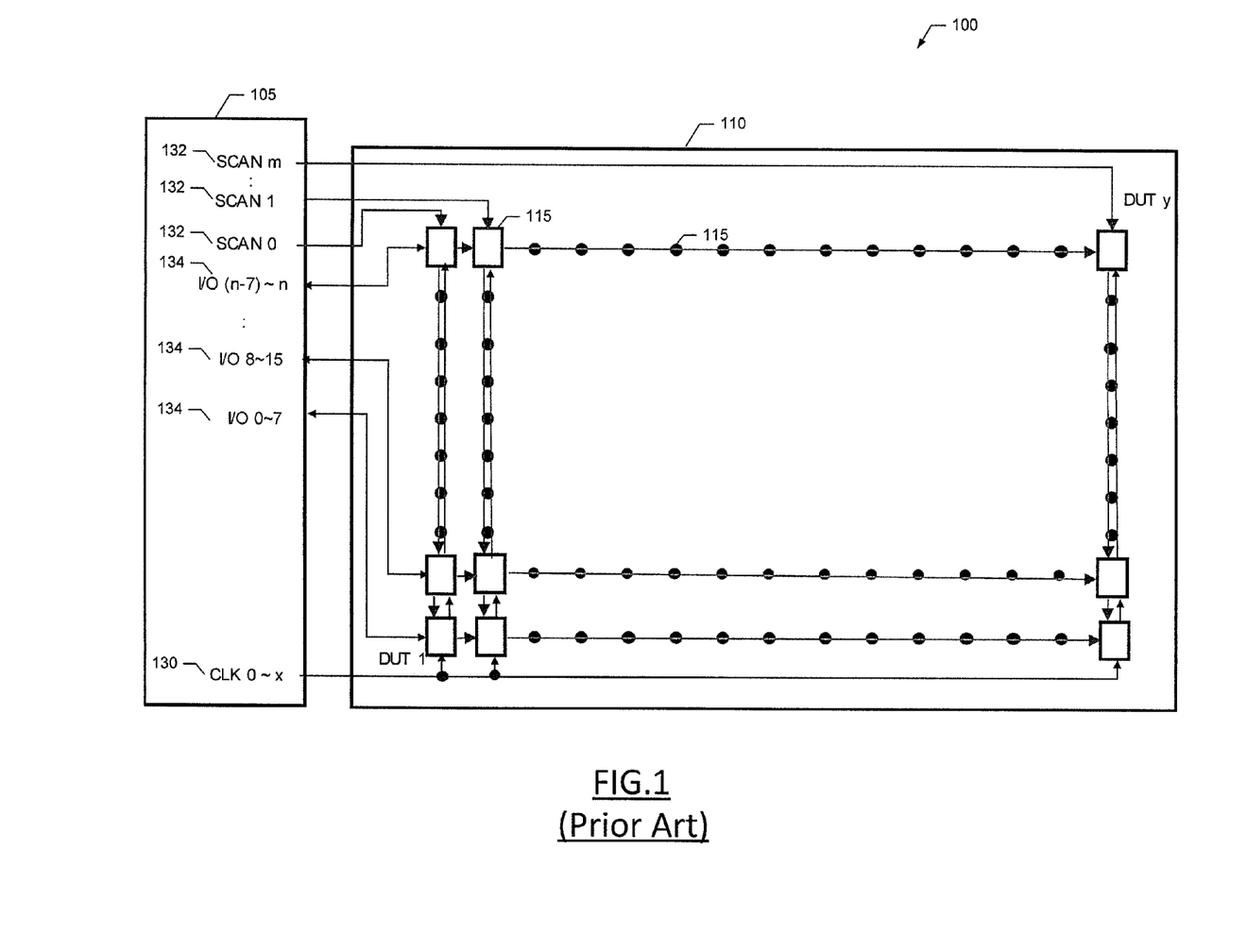
FIG. 1 is a schematic diagram of a conventional burn in test system.

FIG. 1 illustrates a schematic design of a conventional burn in test system 100 comprising a burn in machine 105, such as a drive board, a comparator board, a burn in board 110, etc. The burn in board 110 comprises a plurality of connected components 115, represented as either rectangles or dots, though not all connected components are illustrated in FIG. 1. The components 115, which may each be referred to as a under testing device (DUT), may be arranged in a series of rows and columns.

As shown in FIG. 1, the burn in machine 105 may provide signals over at least one or more clock channels (CLK) 130, one or more scan channels (SCAN) 132, and one or more input/output channels (I/O) 134 to the burn in board 110. The clock signals may be connected to a component 115 on the end of each column. The component 115 receiving the clock signals may then pass the clock signals to the other components 115 in the same column. Similarly, a subset of the input/output signals may be connected to a component 115 on the end of each row. The component 115 receiving the input/output signals may then pass the input/output signals to the other components 115 in the same row. Additionally, a scan signal may be passed to a component 115 on the end of each column. The component 115 receiving the scan signal may then pass the scan signal to the other components 115 in the same column.

Due to the high degree of signal sharing (i.e., of the clock signals, scan signals, and input/output signals) by the components 115 in the conventional burn in test system 100 of FIG. 1, the system 100 may suffer from undesirably increased rise times ($T_R$) and fall times ($T_F$). Additionally, the signals may be affected by high levels of noise. As a result, the conventional burn in test system 100 may experience difficulty verifying the output data of the components 115. Furthermore, the polling efficiency of the ready/busy signals of the components 115 may be reduced. The output of the burn in test system 100 may also be reduced, therefore, leading to increased cost for the burn in process.

Accordingly, it may be desirable to provide improved burn in boards, systems, and methods for subjecting components to a burn in process that overcomes at least some of the above-mentioned and other disadvantages and deficiencies of conventional technologies.

BRIEF SUMMARY

Systems, methods, apparatuses, and computer program products are herein provided for facilitating the use of a burn in board comprising integrated circuits. In an example embodiment, an apparatus is provided. The apparatus may comprise a burn in board and one or more integrated circuits connected to the burn in board. Each integrated circuit may be configured to at least connect to a plurality of components to be subjected to a burn in process at room temperature; receive at least one signal for testing the plurality of components during the burn in process; and transmit the at least one signal to each of the plurality of components. The integrated circuit may further be configured to receive output data from each of the plurality of components; compare the output data from each of the plurality of components with data expected to be read; and transmit a result of the comparison. Additionally, the integrated circuit may be configured to transmit data to be written to each of the plurality of components; request ready state information from each of the plurality of components, wherein the ready state information comprises either an indication that the component is ready or an indication that the component is busy; and receive an indication of a ready state from each of the plurality of components in response to the request.

In another example embodiment, a method for performing a burn in process at room temperature is provided. The method may comprise receiving at least one clock signal and at least one input/output signal for performing the burn in process. Additionally, the method may comprise distributing, by one or more integrated circuits connected to a plurality of components, the at least one clock signal and the at least one input/output signal to the plurality of components. The method may further comprise receiving an output response from each of the plurality of components. The method may also comprise comparing output data of the output response from each of the plurality of components with data expected to be read; and transmitting a result of the comparison. Additionally, the method may comprise transmitting data to be written to each of the plurality of components; requesting ready state information from each of the plurality of components, wherein the ready state information comprises either an indication that the component is ready or an indication that the component is busy; and receiving an indication of a ready state from each of the plurality of components in response to the request.

In yet another example embodiment, a system is provided. The system may comprise a burn in machine and a burn in board. The burn in board may comprise a plurality of component connections; and one or more integrated circuits. Each integrated circuit may be associated with a subset of the plurality of component connections. The system may further comprise at least one information channel connecting the burn in machine and the burn in board. The at least one information channel may be selected from the group consisting of a clock channel and an input/output channel. Each of the one or more integrated circuits may be configured to receive one or more signals via the at least one information connection and to distribute the one or more signals to the subset of the plurality of component connections associated with the respective integrated circuit.

The above summary is provided merely for purposes of summarizing some example embodiments of the invention so as to provide a basic understanding of some aspects of the invention. Accordingly, it will be appreciated that the above described example embodiments are merely examples and should not be construed to narrow the scope or spirit of the invention in any way. It will be appreciated that the scope of the invention encompasses many potential embodiments, some of which will be further described below, in addition to those here summarized.

BRIEF DESCRIPTION OF THE DRAWINGS

The foregoing summary as well as the following detailed description of the various example embodiments of the present invention will be better understood when read in conjunction with the appended drawings. It is understood that the invention is not limited to the precise arrangements and instrumentalities shown and that the drawings are not necessarily drawn to scale. In the drawings.

DETAILED DESCRIPTION

Some embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout.

As used herein, the terms "data," "content," "information" and similar terms may be used interchangeably to refer to data capable of being transmitted, received, displayed and/or stored in accordance with various example embodiments. Thus, use of any such terms should not be taken to limit the spirit and scope of the disclosure.

Use of the term "room temperature," as used herein, is not meant to be limiting and may refer to a temperature of an area subjected to a temperature-controlled environment not subjected to a significantly elevated or reduced temperature. For example, room temperature may be, but is not limited to, a temperature of approximately 20 to 26° C. (68 to 79° F.), 20 to 30° C. (68 to 86° F.), or 15 to 26° C. (59 to 79° C.).

Figure 2:
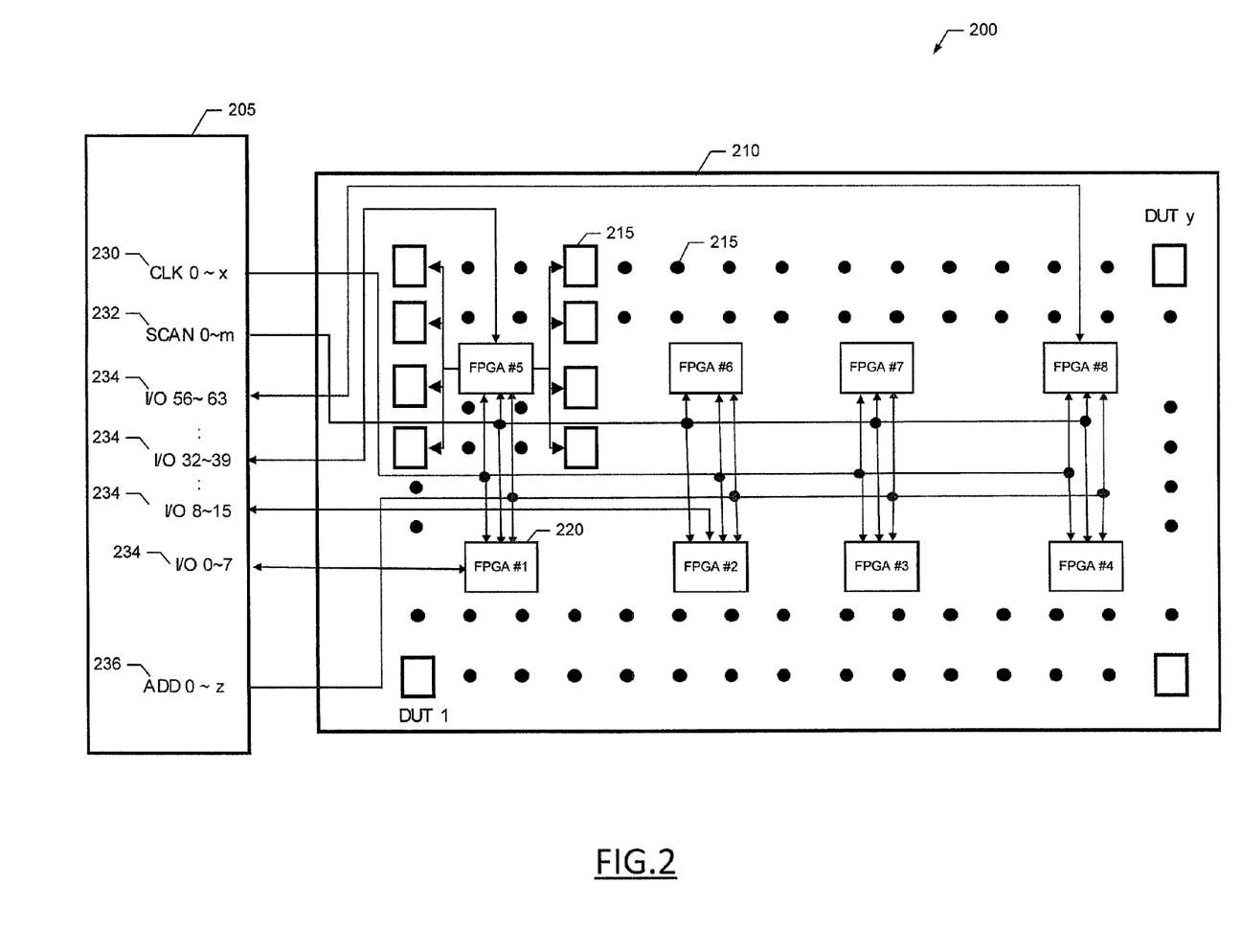
FIG. 2 is a schematic diagram of a burn in test system in accordance with an example embodiment of the present invention.

Referring now to FIG. 2, a schematic diagram is illustrated of a burn in test system 200 for facilitating the use of a burn in board comprising integrated circuits according to some example embodiments. It will be appreciated that the burn in test system 200 as well as the illustrations in other figures are each provided as an example of some embodiments and should not be construed to narrow the scope or spirit of the disclosure in any way. In this regard, the scope of the disclosure encompasses many potential embodiments in addition to those illustrated and described herein. As such, while FIG. 2 illustrates one example of a configuration of a system for facilitating the use of a burn in board comprising integrated circuits, numerous other configurations may also be used to implement embodiments of the present invention.

In at least some embodiments, the burn in test system 200 may comprise a burn in machine 205, which may comprise a drive board, a comparator board, a burn in board 210, etc. The burn in board 210 may comprise a plurality of connected components, which may be referred to as under testing devices, under test devices, devices under test, or devices under testing (DUT) 215, to be tested during a burn in process. For example, a under testing device 215 may comprise a memory component (e.g., static random access memory (SRAM), synchronous dynamic random access memory (SDRAM), flash memory (e.g., high capacity NOR/NAND flash memory), memory cards (e.g., high capacity Secure Digital (SD), Micro SD, Compact Flash, Solid State Disk (SSD), or any other non-volatile memory, memory card, memory module, or other semiconductor device). In FIG. 2, each rectangle or dot depicted on the burn in board 210 may represent a single under testing device 215. It should be appreciated, however, that not all under testing devices 215 that are connected to the burn in board 210 are depicted in FIG. 2. In an example embodiment, the burn in board 210 may comprise two hundred (200) under testing devices 215. The burn in board 210 may further comprise at least one integrated circuit 220. For example, each integrated circuit may be embodied as a field programmable gate array (FPGA), a complex programmable logic device (CPLD), and/or the like. In the example embodiment of FIG. 2, each of the integrated circuits 220 is represented as a field programmable gate array. In an example embodiment, the burn in board 210 may comprise eight (8) integrated circuits 220.

Each of the integrated circuits 220 may be in communication with a plurality of the under testing devices 215. For example, in one embodiment, each integrated circuit 220 may be connected to twenty-five (25) under testing devices 215. In example embodiments, each under testing device 215 may be directly connected to a single integrated circuit 220. That is, in these embodiments, no under testing device 215 may be directly connected to more than one integrated circuit 220.

According to various embodiments, the burn in machine 205, may comprise various channels for communicating with the burn in board 210 and, thereby, the connected integrated circuits 220 and under testing devices 215. The burn in machine 205, in certain embodiments, may comprise at least one channel of each or a subset of the following channel types: clock channels (CLK) 230, scan channels (SCAN) 232, input/output channels (I/O) 234, and address channels (ADD) 236. Rather than connecting directly to at least one under testing device 215 per row or column as in conventional burn in test systems, the various channels may connect to the integrated circuits 220. For example, the clock channels 230, scan channels 232, and address channels 236 may be connected from the burn in machine 205 to each of the integrated circuits 220, as shown in the example embodiment of FIG. 2. In this example, the input/output channels 234 may be divided into at least one subset of input/output channels 234, and each subset of input/output channels 234 may be connected to a respective integrated circuit 220.

The integrated circuits 220 may be configured to receive and/or transmit data or signals over one or more of the connected channels 230, 232, 234, 236. Each integrated circuit 220 of the burn in board 210, in example embodiments, may be configured to distribute to the connected under testing devices 215 one or more signals received via the various channels 230, 232, 234, 236. In this regard, each integrated circuit 220 may act as a buffer for the signals received over the channels 230, 232, 234, 236. Each integrated circuit 220 may further be configured to transmit information to the burn in machine 205 over one or more of the connected channels, for example at least one of the input/output channels 234. In some instances, the integrated circuit 220 may transmit signals originating from the integrated circuit 220, while in other instances the integrated circuit 220 may transmit signals originating with and received from the connected under testing devices 215.

Figure 3:
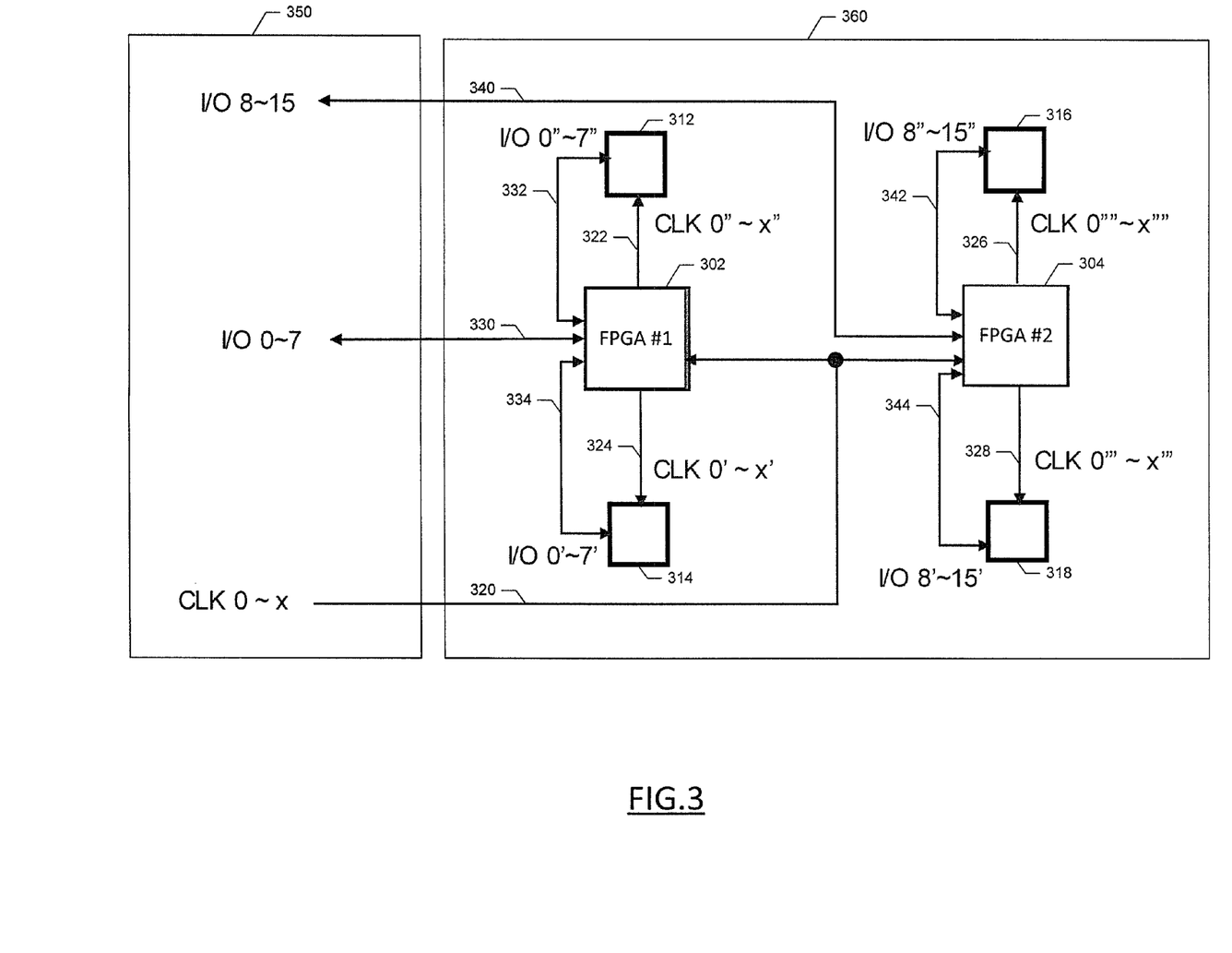
FIG. 3 is a schematic diagram illustrating the distribution of signals by an integrated circuit to one or more under testing devices in accordance with an example embodiment of the present invention.

FIG. 3 illustrates a non-limiting example of the distribution of signals by an integrated circuit to one or more under testing devices. It should be understood that the number of integrated circuits, connected under testing devices, and channels of FIG. 3 are merely used to depict an example, and should not be seen as limiting. FIG. 3 depicts two integrated circuits 302, 304 on a burn in board 360, each of which is connected to two under testing devices 312, 314 and 316, 318, respectively. In FIG. 3, each integrated circuit 302, 304 is connected to a plurality of clock channels 320 originating from a burn in machine 350. Each respective integrated circuit 302, 304 is further connected to a subset of a plurality of input/output signals 330, 340 originating from a burn in machine 350. The integrated circuits 302, 304 may be configured to distribute one or more of the signals received over the clock channels 320 and input/output channels 330, 340 to the connected under testing devices 312, 314, 316, 318. The integrated circuits 302, 304 may further be configured to receive one or more signals from the connected under testing devices 312, 314, 316, 318 to be transmitted to the burn in machine 350 over the input/output channels 330, 340. In some instances, the integrated circuits 302, 304 may process the signals received from the under testing devices 312, 314, 316, 318 prior to transmitting the signals to the burn in machine 350 over the input/output channels 330, 340.

In the example of FIG. 3, integrated circuit 302 may be configured to distribute the signals received via clock channels 320 to under testing devices 312, 314 via clock connections 322, 324 and the signals received via input/output channels 330 to under testing devices 312, 314 via input/output connections 332, 334. Additionally, integrated circuit 304 may be configured to distribute the signals received via clock channels 320 to under testing devices 316, 318 via clock connections 326, 328 and the signals received via input/output channels 340 to under testing devices 316, 318 via input/output connections 342, 344. In some instances, integrated circuit 302 may be configured to receive one or more signals from the under testing devices 312, 314 via input/output connections 332, 334, and integrated circuit 304 may be configured to receive one or more signals from the under testing devices 316, 318 via input/output connections 342, 344. In these instances, integrated circuits 302, 304 may be configured to transmit the signals received from the under testing devices 312, 314, 316, 318 to the burn in machine 350, in some instances after processing the received signals, via input/output channels 330, 340.

Returning to FIG. 2, the integrated circuits 220 and the under testing devices 215 may comprise components for assisting in the performance of a burn in process. In some embodiments, each integrated circuit 220 may comprise logic circuitry and/or one or more memory elements (e.g., registers). For example, memory elements may be configured to store information about the plurality of connected under testing devices 215. The under testing devices 215, according to example embodiments, may also comprise one or more memory elements (e.g., registers). For example, a memory element of the under testing devices 215 may comprise a pass/fail register for use during the burn in process. In certain embodiments, the under testing devices 215 may be configured to provide a ready/busy signal, for example, via a ready/busy connection embedded in an input/output pin or via an independent pin for the ready/busy signal.

The burn in machine 205 may be configured to control the integrated circuits 220 during the performance of a burn in process. In particular, the integrated circuits 220 may be configured to provide various modes of operation, which may be controlled by the burn in machine 205. For example, the integrated circuits 220 may comprise at least modes for (1) performing a read test on the plurality of connected under testing devices 215, (2) reporting the results of a read test to the burn in machine 205, and (3) programming a binary test code on the plurality of connected under testing devices 215. The burn in machine 205 may be configured to control the mode of the integrated circuits 220 using signals transmitted over the one or more address channels 236.

During a read test mode, the burn in machine 205 may be configured to transmit to the integrated circuits 220 via the input/output channels 234 data to be read from the under testing devices 215. The integrated circuits 220 may be configured to receive from the burn in machine 205 the data to be read. Additionally, the integrated circuits 220 may be configured to receive output data from the connected under testing devices 215. In these embodiments, the integrated circuits 220 may be configured to compare the data to be read with the output data. For example, the integrated circuits 220 may be configured to compare any individual bit of the data to be read with the corresponding bit of the received output data. In an instance in which the data to be read is equal to the output data, the pass/fail register of the respective under testing device 215 may indicate a pass; and in an instance in which the data to be read is not equal to the output data, the pass/fail register of the respective under testing device 215 may indicate a fail. In some embodiments, the result of the comparison (e.g., the value of the pass/fail register) may be stored by the respective integrated circuit 220 (e.g., in a memory element) connected to the under testing device 215.

During a read test reporting mode, the integrated circuits 220 may be configured to transmit a signal to the burn in machine 205 via the input/output channels 234 indicating whether each under testing device 215 passed or failed the read test. In this regard, the integrated circuits 220 may be configured to transmit the value of the pass/fail register of each connected under testing device 215 to the burn in machine 205. According to certain embodiments, each integrated circuit 220 may transmit the contents of one or more memory elements on the integrated circuit 220 storing the pass/fail status of each of the connected under testing devices 215. The integrated circuits 220, in some instances, may be configured to process and/or combine (e.g., via the logic circuitry) the pass/fail data from one or more of the connected under testing devices 215 prior to transmitting the data to the burn in machine 205.

During a binary test code programming mode, the burn in machine 205 may be configured to transmit to the integrated circuits 220 via the input/output channels 234 data to be programmed (e.g., written) to the under testing devices 215. The integrated circuits 220 may be configured to transmit the data to be programmed to the connected under testing devices 215, for example to a program data buffer associated with the respective under testing device 215. After receiving the data to be programmed, the under testing devices 215 may be configured to transmit to the connected integrated circuit 220 a ready/busy signal indicating the ready/busy status of the under testing device 215. The burn in machine 205 may be configured to check the ready/busy statuses of the under testing devices 215 using the scan channels 232 connected to the integrated circuits 220.

Figure 4:
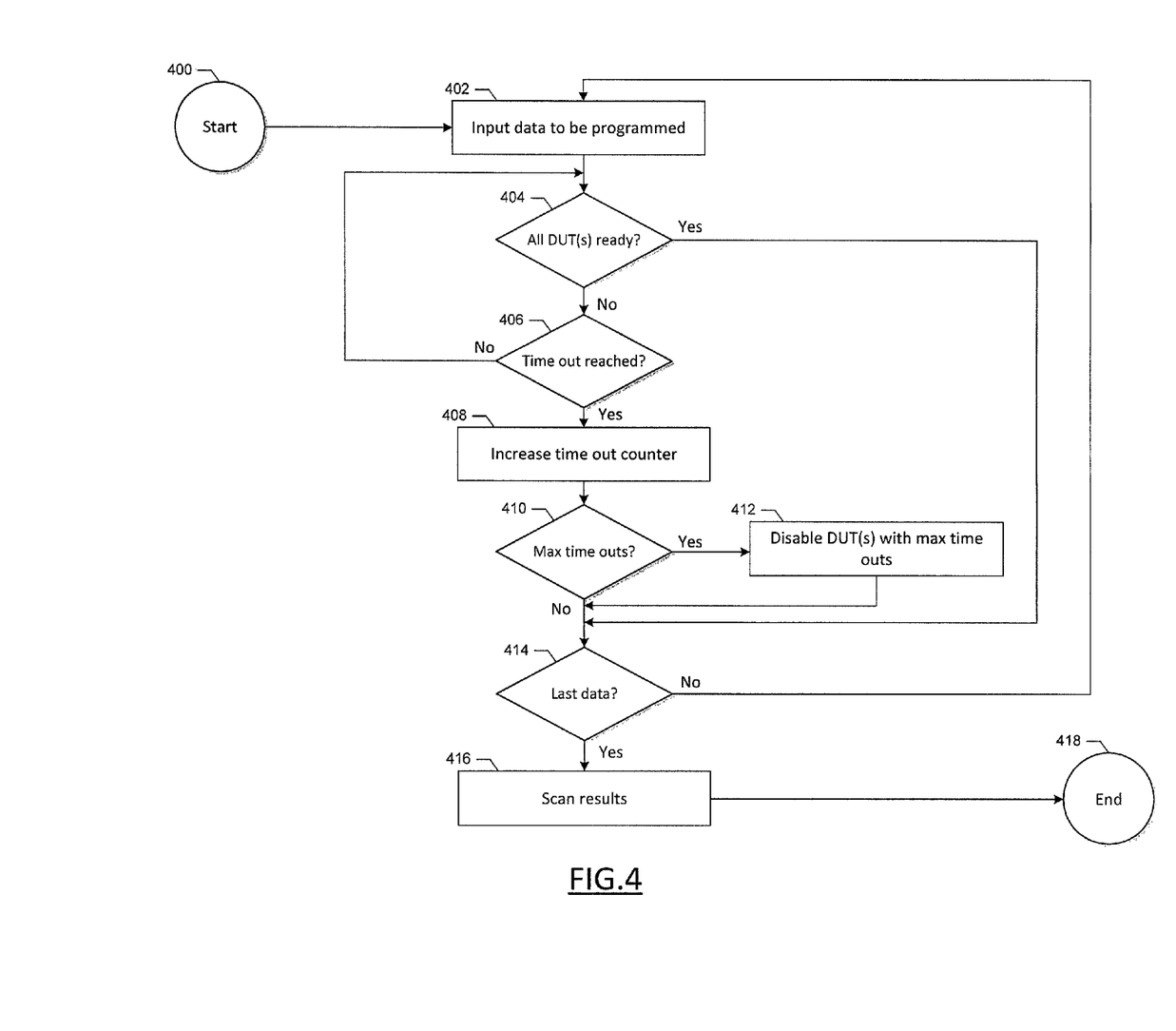
FIG. 4 is a flowchart illustrating some operations of a burn in write test in accordance with another example embodiment of the present invention.

Referring now to FIG. 4, a flowchart is illustrated for programming a binary test code according to some example embodiments. In this regard, FIG. 4 illustrates operations that may be performed by an integrated circuit of example embodiments, such as integrated circuit 220 of FIG. 2. In other embodiments, various operations of the flowchart may be performed by a burn in oven rather than an integrated circuit, for example operations 402, 406, 414, and/or 416. The process for programming a binary test code begins at operation 400. At operation 402, the integrated circuit, such as integrated circuit 220, may input the data to be programmed (e.g., using a program command, page address, program data, and/or the like). For example, the integrated circuit may transmit the data to be programmed (e.g., binary code) received from a burn in machine, such as burn in machine 205, to a plurality of under testing devices (e.g., to the program data buffer of each under testing device), such as under testing devices 215, connected to the integrated circuit.

At operation 404, the integrated circuit, such as integrated circuit 220, may determine whether each connected under testing device, such as under testing device 215, is ready. In this regard, the integrated circuit may receive a ready/busy signal indicating a ready/busy status from each connected under testing device. The integrated circuit, in example embodiments, may determine whether all of the under testing devices connected to the integrated circuit are ready. For example, the integrated circuit may be configured to combine the responses from all of the connected under testing devices (e.g., via an AND operation) into a single response. In an instance in which all of the connected under testing devices are ready, the process may proceed to operation 414. Otherwise, in an instance in which one or more of the connected under testing devices are busy, the process may proceed to operation 406.

At operation 406, the integrated circuit, such as integrated circuit 220, may be configured to determine whether a predetermined time out value has been reached. For example, the integrated circuit may be preconfigured with or assigned a maximum wait time for each piece of data (e.g., page of data) to be programmed (e.g., written). In an instance in which the time out value has not been reached, the process may return to operation 404 to determine whether all connected under testing devices, such as under testing devices 215, are now ready. Otherwise, in an instance in which the time out value has been reached, the process may proceed to operation 408.

At operation 408, the integrated circuit, such as integrated circuit 220, may be configured to increment a time out counter for each connected under testing device, such as under testing device 215, that did not reach a ready state prior to reaching the predetermined time out value for the particular data to be programmed. In this regard, the integrated circuit may comprise one or more memory elements (e.g., registers) for storing the time out counts for each of the connected under testing devices.

At operation 410, the integrated circuit, such as integrated circuit 220, may compare the time out count for each connected under testing device, such as under testing device 215, to a maximum number of time outs allowed. In this regard, the integrated circuit may be preconfigured with or assigned a maximum number of times that a particular under testing device may fail to reach a ready state in the allotted time during the burn in write test. In an instance in which none of the time out counts for the connected under testing devices has reached the maximum number of time outs allowed, the process may proceed to operation 414. Otherwise, in an instance in which the time out count for one or more of the connected under testing devices has reached the maximum number of time outs allowed, the process may proceed to operation 412.

At operation 412, the integrated circuit, such as integrated circuit 220, may be configured to disable the one or more connected under testing devices, such as under testing devices 215, whose time out counts have reached the maximum number of time outs allowed. That is, for the remainder of the burn in write test, the one or more connected under testing devices that have timed out more than an allowable number of times may no longer be tested by the integrated circuit. In this regard, the one or more connected under testing devices that have timed out the maximum number of times may be prevented from causing the test at operation 404 to fail for the remainder of the binary test code programming mode (e.g., for subsequent data to be programmed during the binary test code programming mode). Once the one or more connected under testing devices that have timed out the maximum number of times are disabled by the integrated circuit, the process may continue to operation 414.

At operation 414, the integrated circuit, such as integrated circuit 220, may determine whether the current data (e.g., page of data) to be programmed (e.g., written) is the last data to be programmed during the binary test code programming mode. In an instance in which the current data is not the last data to be programmed during the binary test code programming mode, the process may return to operation 402 to input the next data (e.g., page) of the binary test code programming mode. Otherwise, in an instance in which the current data is the last data to be programmed during the binary test code programming mode, the process may proceed to operation 416.

At operation 416, the integrated circuit, such as integrated circuit 220, may receive a signal from the burn in machine, such as burn in machine 205, via scan channels, such as scan channels 232, for determining the results of the binary test code programming mode. In this regard, the scan channels may be used to determine from the integrated circuit the results of the binary test code programming mode with respect to each of the connected under testing devices, such as under testing devices 215. For example, one or more scan channels may be used to select individual integrated circuits, and one or more scan channels may be used to select the connected under testing device controlled by each integrated circuit. In some embodiments, one bit of the scan signal may be used to identify which block of the integrated circuit is to be controlled, and one or more additional bits of the scan signal may be used to identify which under testing device of the block is to be controlled. In this regard, a block may refer to a plurality of under testing devices controlled by a particular integrated circuit. Once the results of the binary test code programming mode are determined, the process terminates at operation 418.

FIG. 4 illustrates a flowchart of a system, method, and computer program product according to an example embodiment. It will be understood that each block of the flowchart, and combinations of blocks in the flowchart, may be implemented by various means, such as hardware and/or a computer program product comprising one or more computer-readable mediums having computer readable program instructions stored thereon. For example, one or more of the procedures described herein may be embodied by computer program instructions of a computer program product. In this regard, the computer program product(s) which embody the procedures described herein may be stored by one or more memory devices and executed by, for example, a processor. In some embodiments, the computer program instructions comprising the computer program product(s) which embody the procedures described above may be stored by memory devices of a plurality of computing devices. As will be appreciated, any such computer program product may be loaded onto a computer or other programmable apparatus to produce a machine, such that the computer program product including the instructions which execute on the computer or other programmable apparatus creates means for implementing the functions specified in the flowchart block(s). Further, the computer program product may comprise one or more computer-readable memories on which the computer program instructions may be stored such that the one or more computer-readable memories can direct a computer or other programmable apparatus to function in a particular manner, such that the computer program product comprises an article of manufacture which implements the function specified in the flowchart block(s). The computer program instructions of one or more computer program products may also be loaded onto a computer or other programmable apparatus to cause a series of operations to be performed on the computer or other programmable apparatus to produce a computer-implemented process such that the instructions which execute on the computer or other programmable apparatus implement the functions specified in the flowchart block(s).

Accordingly, blocks of the flowchart support combinations of means for performing the specified functions. It will also be understood that one or more blocks of the flowchart, and combinations of blocks in the flowchart, may be implemented by special purpose hardware-based computer systems which perform the specified functions, or combinations of special purpose hardware and computer program product(s).

The above described functions may be carried out in many ways. For example, any suitable means for carrying out each of the functions described above may be employed to carry out embodiments of the invention. In one embodiment, a suitably configured processor or integrated circuit may provide all or a portion of the elements. In another embodiment, all or a portion of the elements may be configured by and operate under control of a computer program product. The computer program product for performing the methods of an example embodiment includes a computer-readable storage medium, such as a non-volatile storage medium, and computer-readable program code portions, such as a series of computer instructions, embodied in the computer-readable storage medium.

Various embodiments of the present invention provide advantages over conventional burn in test systems. Embodiments of the present invention provide for the addition of integrated circuits to a burn in board, which may be achieved using relatively low cost equipment and accessories. Several embodiments advantageously improve the output and reduce the cost of burning in one or more under testing devices. Other advantageous embodiments reduce the amount of sharing and/or overlap of signals (e.g., clock, scan, address, and input/output signals), which may in turn advantageously reduce the noise in the signals as well as the rise times ($T_R$) and fall times ($T_F$). Certain advantageous embodiments further provide for improved efficiency with respect to burning in the desired components. For example, through the use of the integrated circuits, various embodiments advantageously allow for improved comparison of component output during a read test and improved efficiency in polling ready/busy signals during a burn in write test. According to various advantageous embodiments, the integrated circuits may be used to expand the number of signals, and to process and/or isolate those signals. In some embodiments, the methods and apparatuses described above may be applied to other component testers and accessories (e.g., Hifix and load board).

Many modifications and other embodiments of the inventions set forth herein will come to mind to one skilled in the art to which these inventions pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the invention. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the invention. In this regard, for example, different combinations of elements and/or functions than those explicitly described above are also contemplated within the scope of the invention. Although specific terms are employed herein, they are used in a generic and descriptive sense only and not for purposes of limitation.

The invention claimed is:

1. An apparatus comprising:
a burn in board; and
one or more integrated circuits connected to the burn in board, each integrated circuit configured to at least:
 connect to a plurality of components to be subjected to a burn in process at room temperature;
 receive at least one signal for testing the plurality of components during the burn in process;
 transmit the at least one signal to each of the plurality of components;
 transmit data to be written to each of the plurality of components;
 request ready state information from each of the plurality of components, wherein the ready state information comprises either an indication that the component is ready or an indication that the component is busy; and
 receive an indication of a ready state from each of the plurality of components in response to the request.

2. The apparatus of claim 1, wherein the at least one signal is selected from the group consisting of a clock signal and an input/output signal.

3. The apparatus of claim 1, wherein the at least one signal comprises data expected to be read from each of the plurality of components.

4. The apparatus of claim 3, wherein each integrated circuit is further configured to:
receive output data from each of the plurality of components;
compare the output data from each of the plurality of components with the data expected to be read; and
transmit a result of the comparison.

5. The apparatus of claim 1, wherein the at least one signal comprises the data to be written to each of the plurality of components.

6. The apparatus of claim 5, wherein each integrated circuit is further configured to:
combine the indication of a ready state from each of the plurality of components into a single response.

7. The apparatus of claim 5, wherein in an instance in which the ready state information associated with at least one of the plurality of components comprises an indication that the component is busy, the integrated circuit associated with the at least one of the plurality of components is further configured to:
- determine whether a time out threshold has been reached; and
- in an instance in which the time out threshold has not been reached, repeat the request for ready state information from each of the plurality of components.

8. The apparatus of claim 7, wherein in an instance in which the time out threshold has been reached, the integrated circuit associated with the at least one of the plurality of components is further configured to:
- increment a time out counter associated with each of the at least one of the plurality of components comprising ready state information comprising an indication that the component is busy.

9. The apparatus of claim 8, wherein the integrated circuit associated with the at least one of the plurality of components is further configured to:
- compare the time out counter value of each of the at least one of the plurality of components with a maximum time out value; and
- in an instance in which the time out counter value for one or more of the at least one of the plurality of components equals the maximum time out value, disable the one or more of the at least one of the plurality of components.

10. The apparatus of claim 1, wherein the apparatus comprises a plurality of integrated circuits.

11. A method for performing a burn in process at room temperature, the method comprising:
- receiving at least one clock signal and at least one input/output signal for performing the burn in process;
- distributing, by one or more integrated circuits connected to a plurality of components, the at least one clock signal and the at least one input/output signal to the plurality of components;
- receiving an output response from each of the plurality of components;
- transmitting data to be written to each of the plurality of components; and
- requesting ready state information from each of the plurality of components, wherein the ready state information comprises either an indication that the component is ready or an indication that the component is busy; and
- wherein receiving an output response from each of the plurality of components further comprises receiving an indication of a ready state from each of the plurality of components in response to the request.

12. The method of claim 11, wherein the at least one input/output signal comprises data expected to be read from each of the plurality of components.

13. The method of claim 11, wherein the output response from each of the plurality of components comprises output data, the method further comprising:
- comparing the output data from each of the plurality of components with the data expected to be read; and
- transmitting a result of the comparison.

14. The method of claim 11, wherein the at least one input/output signal comprises the data to be written to each of the plurality of components.

15. The method of claim 14, further comprising:
- combining the indication of a ready state from each of the plurality of components into a single response.

16. The method of claim 14, wherein in an instance in which the ready state information associated with at least one of the plurality of components comprises an indication that the component is busy, the method further comprises:
- determining whether a time out threshold has been reached; and
- in an instance in which the time out threshold has not been reached, repeating the request for ready state information from each of the plurality of components.

17. The method of claim 16, wherein in an instance in which the time out threshold has been reached, the method further comprises:
- determining the at least one of the plurality of components comprising ready state information comprising an indication that the component is busy; and
- incrementing a time out counter associated with each of the at least one of the plurality of components comprising ready state information comprising an indication that the component is busy.

18. The method of claim 17, further comprising:
- comparing the time out counter value of each of the at least one of the plurality of components with a maximum time out value; and
- in an instance in which the time out counter value for one or more of the at least one of the plurality of components equals the maximum time out value, disabling the one or more of the at least one of the plurality of components.

19. A system comprising:
- a burn in machine;
- a burn in board comprising:
  - a plurality of component connections; and
  - one or more integrated circuits, each integrated circuit associated with a subset of the plurality of component connections; and
- at least one information channel connecting the burn in machine and the burn in board, the at least one information channel selected from the group consisting of a clock channel and an input/output channel;
- wherein each of the one or more integrated circuits is configured to:
  - receive one or more signals via the at least one information channel;
  - distribute the one or more signals to the subset of the plurality of component connections associated with the respective integrated circuit;
  - transmit data to be written to each of the plurality of components;
  - request ready state information from each of the plurality of components, wherein the ready state information comprises either an indication that the component is ready or an indication that the component is busy; and
  - receive an indication of a ready state from each of the plurality of components in response to the request.

* * * * *